United States Patent
Wen

[11] Patent Number: 5,891,778
[45] Date of Patent: Apr. 6, 1999

[54] METHOD OF FABRICATING A SEMICONDUCTOR READ-ONLY MEMORY DEVICE BASED ON A SILICON-ON-INSULATION STRUCTURE

[75] Inventor: Jemmy Wen, Hsinchu City, Taiwan

[73] Assignee: United Microelectronics Corp., Taiwan

[21] Appl. No.: 843,720

[22] Filed: Apr. 17, 1997

[30] Foreign Application Priority Data

Feb. 3, 1997 [TW] Taiwan .................................. 86101233

[51] Int. Cl.$^6$ .............................................. H01L 21/8246
[52] U.S. Cl. ......................... 438/276; 438/130; 438/155; 438/589
[58] Field of Search ..................................... 438/130, 151, 438/155, 156, 164, 275, 276, 277, 278, 589

[56] References Cited

U.S. PATENT DOCUMENTS

| | | |
|---|---|---|
| 4,694,566 | 9/1987 | Conner et al. ........................... 438/130 |
| 5,403,762 | 4/1995 | Takemura ................................. 438/164 |
| 5,460,987 | 10/1995 | Wen et al. ............................... 438/589 |
| 5,504,025 | 4/1996 | Fong-Chun et al. ..................... 438/278 |
| 5,627,091 | 5/1997 | Hong ........................................ 438/276 |
| 5,668,031 | 9/1997 | Hsue et al. .............................. 438/275 |

*Primary Examiner*—Chandra Chaudhari
*Attorney, Agent, or Firm*—Finnegan, Henderson, Farabow, Garrett & Dunner, L.L.P.

[57] ABSTRACT

A method for fabricating a semiconductor read-only memory (ROM) device of the type including a plurality of diode-type memory cells is provided. The ROM device is based on a silicon-on-insulation (SOI) structure in which all of the memory cells of the ROM device are formed in an insulating layer over a silicon substrate. The SOI structure allows for the prevention of leakage current between neighboring bit lines. The memory cells of the ROM device are each based on a P-N junction diode, which allows for a higher integration of the memory cells on a single chip than the use of MOSFET-based memory cells. The coding process is also easier to conduct.

26 Claims, 3 Drawing Sheets

METHOD OF FABRICATING A SEMICONDUCTOR READ-ONLY MEMORY DEVICE BASED ON A SILICON-ON-INSULATION STRUCTURE

BACKGROUND OF THE INVENTION

1. Field of the Invention

This invention relates to semiconductor memory devices, and more particularly, to a method for fabricating a semiconductor read-only memory (ROM) device of the type including a plurality of diode-type memory cells which are constructed based on a silicon-on-insulation (SOI) structure.

2. Description of Related Art

Read-only memory (ROM) is a nonvolatile semiconductor memory widely used in computer and microprocessor systems for permanently storing information including programs and data that are repeatedly used, such as the BIOS (abbreviation for Basic Input/Output System, which is a widely used operating system on personal computers) or the like. The manufacture of ROMS involves very complicated and time-consuming processes and requires costly equipment and material to achieve. Therefore, the data to be permanently stored in ROMS is usually first defined by the customer and then furnished to the factory to be programmed into the ROMs.

Most ROMs are identical in semiconductor structure except for the different data stored therein. Therefore, the ROM devices can be fabricated up to the stage where they are ready for data programming and then the semi-finished products are stocked in inventory awaiting customer orders. The customer then furnished the data to the factory where the data are stored in the semi-finished ROMs by using the so-called mask-programming process. This procedure is now a standard method in the semiconductor industry for fabricating ROMs.

In most conventional ROMS, metal-oxide semiconductor field-effect transistors (MOSFET) are used as the memory cells for data storage. In the mask programming stage, impurities are selectively doped into specific channels in the MOSFET memory cells so as to change the threshold voltage thereof, thereby setting the MOSFET memory cells to ON/OFF states representing different binary data. The MOSFET memory cells are connected to the external circuits via a plurality of polysilicon-based word lines and bit lines. The channel regions are located beneath the word lines and between each pair of adjacent bit lines. Whether one MOSFET memory cell is set to store a binary digit of 0 or 1 is dependent on whether the associated channel is doped with impurities or not. If the associated channel is doped with impurities, the MOSFET memory cell is set to a low threshold voltage, effectively setting the MOSFET memory cell to a permanently-ON state representing the storage of a binary digit of 0, for example; otherwise, the MOSFET memory cell is set to a high threshold voltage, effectively setting the MOSFET memory cell to a permanently-OFF state representing the storage of a binary digit of 1.

One conventional type of MOSFET-based ROM device is shown and depicted in the following with reference to FIGS. 1A through 1C, in which FIG. 1A is a schematic top view of the ROM device; FIG 1B is a cross-sectional view of the ROM device of FIG. 1 cutting through the line 1B—1B and FIG. 1C is a cross-sectional view of the ROM device of FIG. 1 cutting through the 1C—1C.

As shown, the conventional ROM device includes a semiconductor substrate, such as a P-type silicon substrate, on which a plurality of parallel-spaced bit lines 11 and a plurality of parallel-spaced word lines 13 intercrossing the bit lines 11 are formed. The word lines 13 are separated from the underlying bit lines by an oxidation layer 12. This ROM device includes a plurality of MOSFET memory cells, each being associated with one segment of the word lines 13 between each neighboring pair of the bit lines 11.

Referring the FIG. 1C, in the method for fabricating the foregoing ROM device, the first step is to conduct an ion-implantation process so as to dope an N-type impurity material such as arsenic (As), into selected regions of the substrate 10 to form a plurality of parallel-spaced diffusion regions serving as the bit lines 11. The interval region between each neighboring pair of the bit lines 11 serves as a channel region 16. Subsequently, a thermal-oxidation process is performed in the wafer so as to form the oxidation layer 12 over the entire top surface of the wafer. Next, a conductive layer, such as a highly-doped polysilicon layer is formed over the wafer, and then selectively removed through a photolithographic and etching process. The remaining portions of the conductive layer serve as the word lines 13. This completes the fabrication of a semi-finished product of the ROM device awaiting a customer order.

In the mask-programming process, a mask 15 is placed over the wafer. This mask 15 is predefined to form a plurality of openings according to the bit pattern of the data that are to be programmed into the ROM device form permanent storage. These openings expose those channel regions that are associated with a selected group of MOSFET memory cells that are to set to a permanently-ON state, with all the other MOSFET memory cells being to be set to a permanently-OFF state. Subsequently, an ion-implantation process is performed on the wafer so as to dope a P-type impurity material such as boron, into the exposed channel regions. This completes the so-called code implantation process.

In the finished product of the ROM device, the doped channel regions cause the associated MOSFET memory cells to be set to a low threshold voltage, effectively setting the MOSFET memory cells to a permanently-ON state representing the permanent storage of a first binary digit, for example 0. On the other hand, the undoped channel regions cause the associated MOSFET memory cells to be set to a high threshold voltage, effectively setting the MOSFET memory cells to a permanently-OFF state representing the permanent storage of a second binary digit, for example 1.

One drawback to the foregoing MOSFET-based ROM device is that its MOSFET memory cells are constructed on a silicon substrate, which limits its application scope. Moreover, when the ROM device is further downsized, the leakage current between the bit lines will be increased, which can cause faulty reading of the data from the memory cells. To prevent the leakage current, one solution is to form an isolation layer, such an insulating layer or an impurity-doped layer, beneath the bit lines. However, this will make the fabrication process more complex.

SUMMARY OF THE INVENTION

It is therefore a primary objective of the present invention to provide a method for fabricating a ROM device based on an SOI structure which allows the memory cells of the ROM device to be constructed without occupying excessive space on the silicon substrate.

It is another objective of the present invention to provide a method for fabricating a ROM device base on an SOI structure which can allow for the prevention of leakage current between neighboring bit lines.

It is still another objective of the present invention to provide a method for fabricating a ROM device based on an SOI structure whose memory cells are each associated with a P-N junction diode for increased integration of the memory cells on a single chip.

It is yet another objective of the present invention to provide a method for fabricating a ROM device based on an SOI structure which can allow the coding process to be easier to conduct than the prior art.

In accordance with the foregoing and other objectives of the present invention, an improved method for fabricating a ROM device of the type including a plurality of diode-type memory cells base on an SOI structure is provided.

The method of the invention includes the following steps of:

(1) preparing a semiconductor substrate, and then forming a first insulating layer over the substrate;

(2) removing selected portions of the first insulating layer so as to form a plurality of substantially parallel-spaced trenches therein in a first direction;

(3) forming a plurality of first diffusion regions of a first semiconductor type each in a lower portion of one of the trenches to serve as a plurality of bit lines for the ROM device;

(4) forming a plurality of second diffusion regions of a second semiconductor type each in an upper portion of one of the trenches;

(5) forming a second insulating layer over the first insulating layer;

(6) removing selected portions of the second insulating layer so as to form a plurality of contact windows which expose a number of predefined portions of the second diffusion regions that are associated with a first group of memory cells of the ROM device that are to be set to a permanently-ON state;

(7) forming a conductive layer over the second insulating layer, the conductive layer filling up each of the contact windows to come into electrical contact with the exposed portions of the second diffusion regions; and (8) removing selected portions of the conductive layer so as to form a plurality of substantially parallel-spaced word lines in a second direction intercrossing the bit lines.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

This invention provides a method for fabricating a ROM device based on an silicon-on-insulation (SOI) structure. In the following disclosure of the invention, the insulation is a field oxide layer on a silicon substrate. However, it is to be understood that the insulation is not limited to the field oxide layer. Various other insulating materials or dielectrics can be used instead, which is apparent to those skilled in the art of semiconductor technology.

Figure 1A:
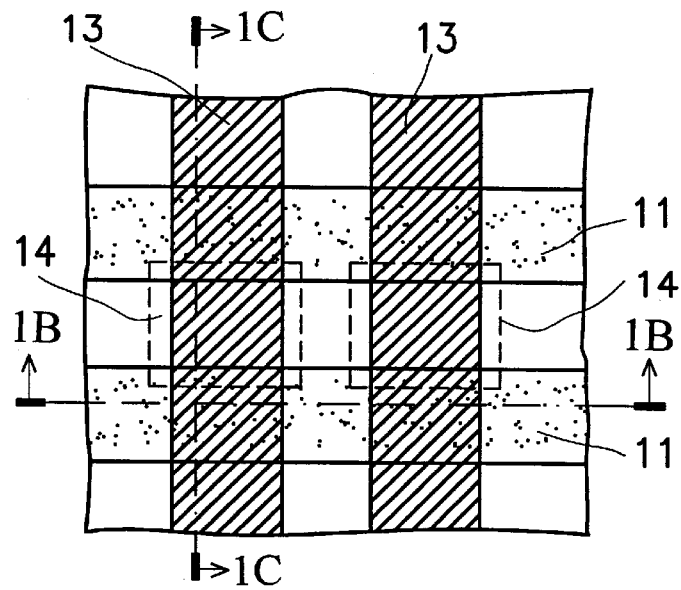
FIG. 1A is a schematic top view of a conventional MOSFET-based ROM device.
Figure 1B:
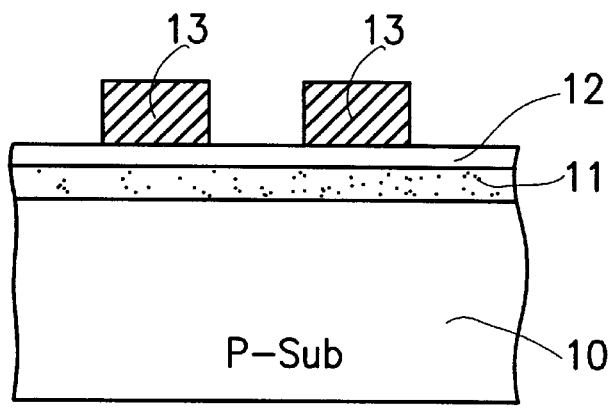
FIG. 1B is a cross-sectional view of the conventional ROM device of FIG. 1A cutting through the line 1B—1B.
Figure 1C:
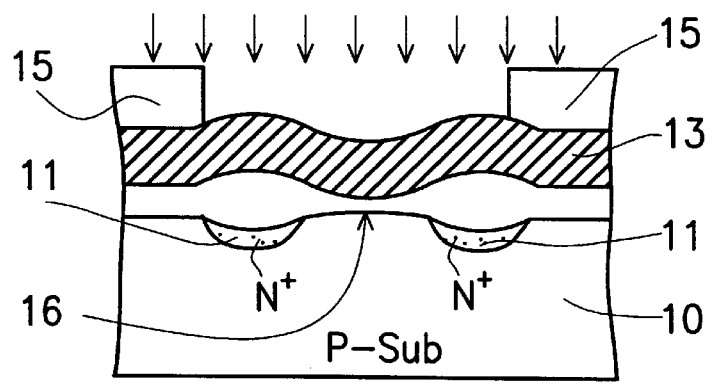
FIG. 1C is another cross-sectional view of the conventional ROM device of FIG. 1A cutting through the line 1C—1C.
Figure 2A:
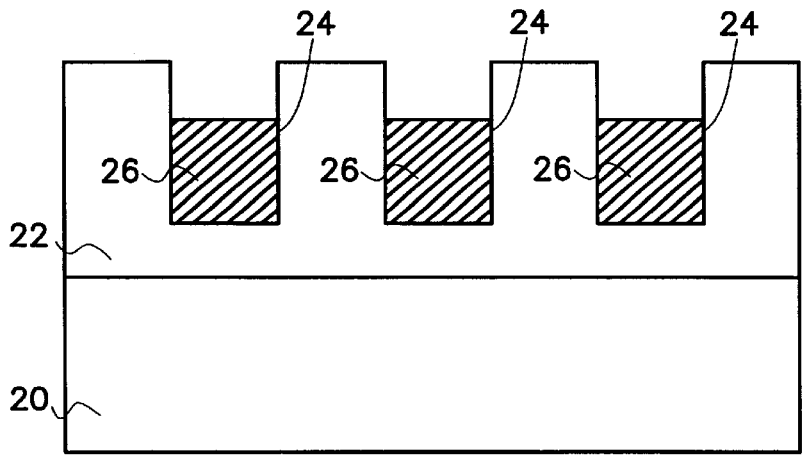
FIGS. 2A through 2C are schematic sectional diagrams used to depict the steps involved in the method of the invention for fabricating a ROM device based on an silicon-on-insulation (SOI) structure.
Figure 2B:
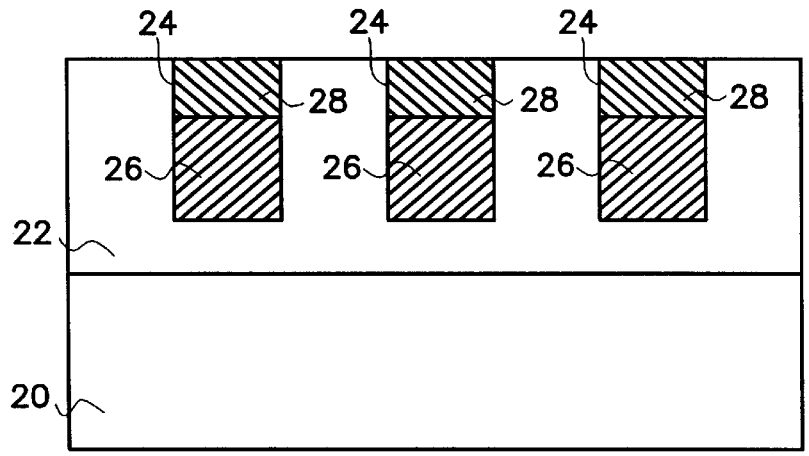
Figure 2C:
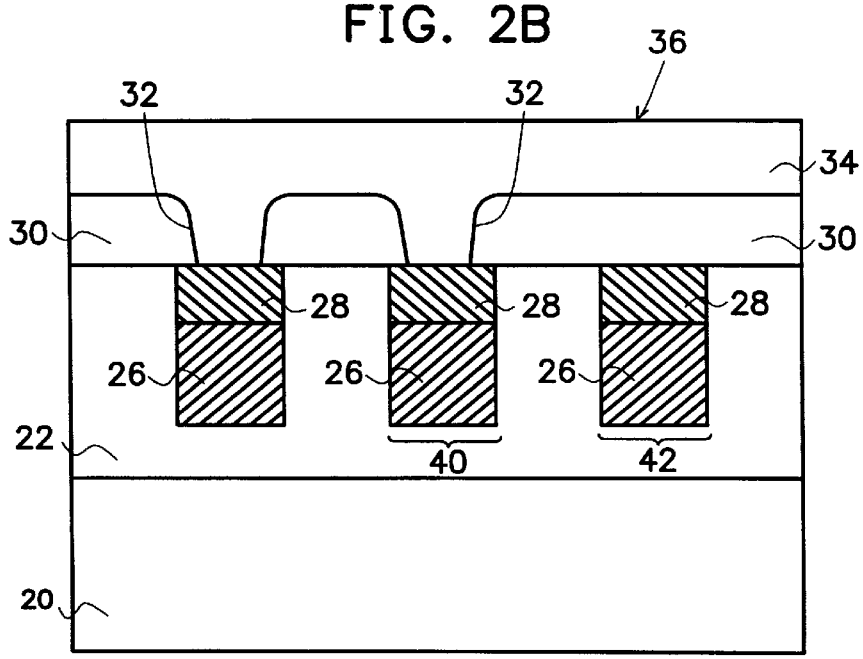

FIGS. 2A through 2C are schematic sectional diagrams used to depict the steps involved in the method of the invention for fabricating a ROM device based on an SOI structure. This ROM device is of the type including an array of diode-type memory cells for permanent storage of binary data.

Referring first to FIG. 2A, in the first step, a semiconductor wafer, such as a silicon substrate 20, is prepared. Over the silicon substrate 20, an insulating layer 22, such as an oxide layer, is formed by thermal oxidation or chemical-vapor deposition (CVD), for example. After this, a photo-lithographic and etching process is performed on the wafer so as to remove selected portions of the insulating layer 22 to form a plurality of substantially parallel-spaced trenches 24 therein. The bottom of these trenches 24 is still a predefined distance away from the topmost surface of the silicon substrate 20.

Subsequently, a plurality of first diffusion regions 26 of a first semiconductor type, for example N-type, are each formed in one of the trenches 24. The first diffusion regions 26 are formed for example, by first depositing a plurality of polysilicon layers respectively into each of the trenches 24 to fill up the same, then doping an impurity material of the first semiconductor type, for example N-type, into the polysilicon layers to form a plurality of etch-back process thereon until the top surface thereof is lowered to a predetermined depth from the topmost surface of the insulating layer 22. The remaining portions of the diffusion regions are then the above-mentioned first diffusion regions 26 which serve as a plurality of bit lines for the ROM device.

Referring next to FIG. 2B, in the subsequent step, a plurality of second diffusion regions 28 of a second semiconductor, for example P-type, are formed respectively on one of the first diffusion regions 26 in each of the trenches 24. The second diffusion regions 28 can be formed, for example, by first depositing a plurality of polysilicon layers respectively on each of the first diffusion regions 26, then doping an impurity material of a second semiconductor type, for example P-type, into the polysilicon layers to form a plurality of diffusion regions of the second semiconductor type, and finally performing an anisotropic etch-back process or a chemical-mechanical polish (CMP) process thereon until the top surface thereof is level with the topmost surface of the insulating layer 22.

Alternatively, the second diffusion regions 28 can be formed by first depositing a plurality of polysilicon layers which are then lightly doped with an impurity material of the first semiconductor type, then performing an anisotropic etch-back process or a chemical-mechanical polish (CMP) process thereon until the top surface thereof is level with the top-most surface of the insulating layer 22, and finally doping an impurity material of the second semiconductor type, such as the P-type $BF_2^-$ ions, into the lightly-doped polysilicon layers so as to turn it into a plurality of heavily-doped polysilicon layers. These heavily-doped polysilicon layers are then the above-mentioned second diffusion regions 28.

In each of the trenches 24, the first diffusion region 26, which is impurity-doped into the first semiconductor type, and the second diffusion region 28, which is impurity-doped into the second semiconductor type, in combination form a P-N junction diode which is associated with one memory cell of the ROM device.

Referring further to FIG. 2C, the subsequent step is to perform the coding process so as to store binary data permanently in the ROM device. First, an insulating layer 30, such as a layer of silicon dioxide or a layer of silicon nitride, is formed over the wafer, and then selectively removed to form a plurality of contact windows 32 to expose a selected number of locations on the second diffusion regions 28 that are associated with a first selected group of the memory cells of the ROM device that are to be set to a permanently-ON state. A second group of the memory cells of the ROM device that are to be set to a permanently-OFF state have the associated second diffusion regions 28 covered by the insulating layer 30. In the case of FIG. 2C, for example, the memory cell 40 is to be set to a permanently-ON state since the associated one of the second diffusion regions 28 is exposed, while the memory cell 42 is to be set to a permanently-OFF state since the associated one of the second diffusion regions 28 is unexposed.

Subsequently, a conductive layer 34, such as a layer of aluminum, titanium, tungsten, or a highly-doped polysilicon layer, is formed over the insulating layer 30. The conductive layer 34 fills up all of the contact windows 32 in the insulating layer 30 and comes into electrical contact with all the exposed ones of the second diffusion regions 28.

Figure 3:
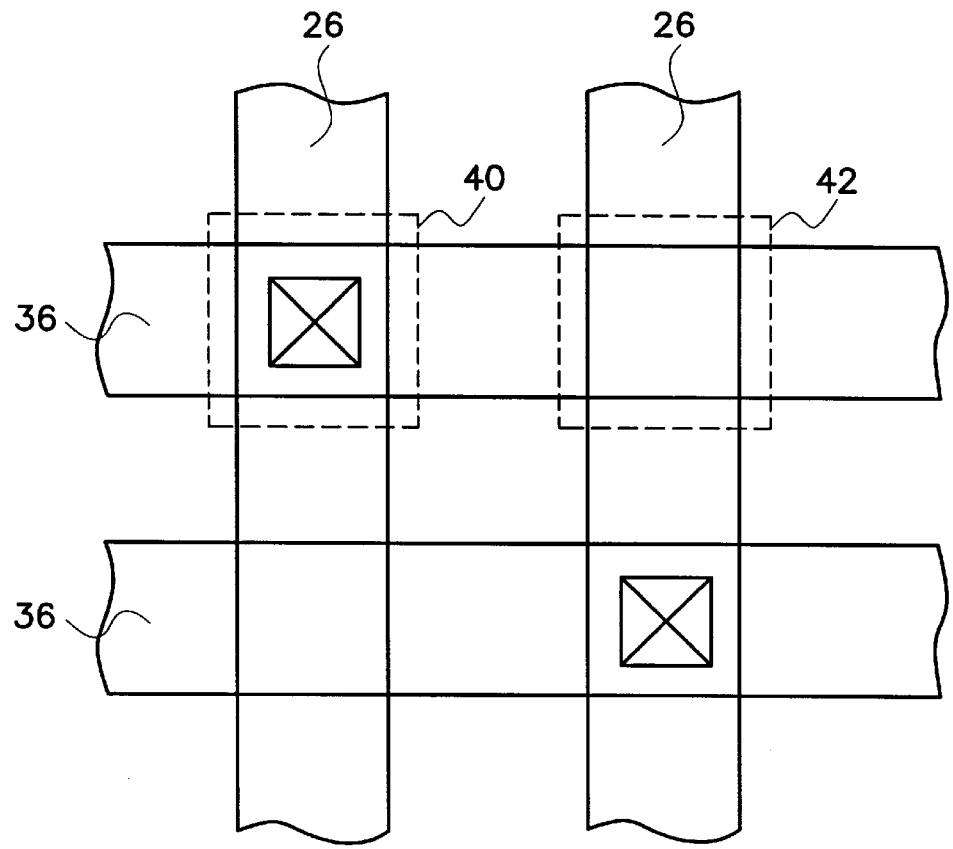
FIG. 3 shows a schematic top view of the finished product of the ROM device of FIG. 2C.

Referring also to FIG. 3, the conductive layer 34 is then selectively removed to form a plurality of substantially parallel-spaced word lines 36 which intercross the first diffusion regions (bit lines) 26 substantially at a right angle. This completes the fabrication of the ROM device based on an SOI structure.

In the top view of FIG. 3, it can be seen that an array of memory cells are formed on the ROM device, respectively at each of the intersections between the word lines 36 and the bit lines 26. In the example of FIG. 3, the memory cells that are marked by a crossed box indicate that a contact window is predefined and formed thereon and therefore are set to a permanently-ON state, as exemplarily indicated by the one labeled with the reference numeral 40; while the memory cells that are not marked with a crossed box indicate that no contact windows are predefined and formed thereon and are therefore set to a permanently-OFF state, as exemplarily indicated by the one labeled with the reference numeral 42.

Figure 4:
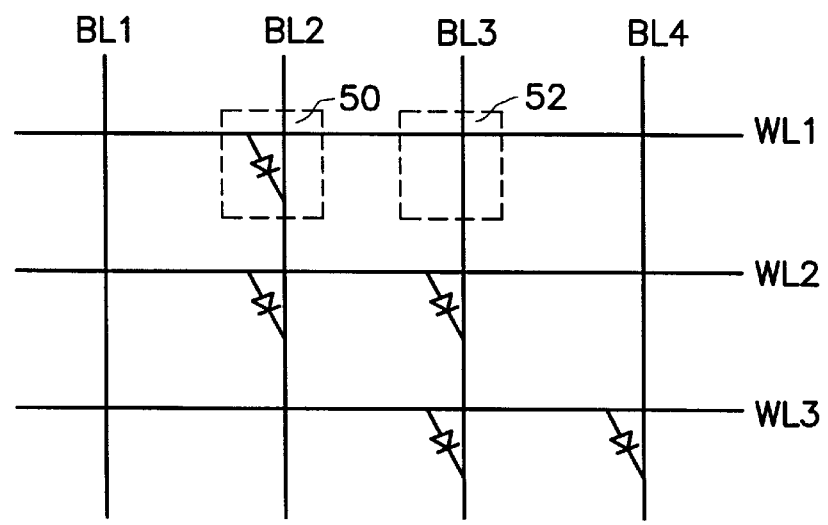
FIG. 4 shows an equivalent circuit diagram of the ROM device of FIG. 2C.

FIG. 4 shows an equivalent circuit diagram of the ROM device based on an SOI structure. This diagram shows that the ROM device can be accessed via a plurality of word lines WL1, WL2, WL3 and a plurality of bit lines BL1, BL2, BL3, BL4. Each of the intersections between the word lines and the bit lines is a location where one memory cell of the ROM device is formed. In the foregoing preferred embodiment, the first semiconductor type is N-type while the second semiconductor type is P-type. Therefore, if one memory cell is set to a permanently-ON state, that memory cell is labeled with a diode symbol with the positive side connected to the associated word line and the negative side connected to the associated bit line, as exemplarily indicated by the memory cell labeled with the reference numeral 50 in FIG. 4. Otherwise, the memory cell is set to a permanently-OFF state, as exemplarily indicated by the memory cell labeled with the reference numeral 52.

To read the data stored in a particular memory cell, for example the memory cell 50, a positive potential is applied to the associated work line WL1 while grounding the associated bit line, BL2 and setting all of the other word lines and bit lines to a floating state. Since the memory cell 50 is set to a permanently-ON state, a current will flow through the P-N junction diode in the memory cell 50 to the associated bit line BL2. The appearance of a current in the associated bit line BL2 indicates that the memory cell 50 is set to a permanently-ON state, representing a first value of binary data, for example 0.

To read data from another memory cell, for example the memory cell 52, a positive potential is applied to the associated word line WL1 while grounding the associated bit line BL3 and setting all of the other work lines and bit lines to a floating state. Since the memory cell 52 is set to a permanently-OFF state, no current will appear in the associated bit line BL3. This indicates that the memory cell 52 is set to a permanently-OFF state, representing a second value of binary data, for example 1.

In the case of the first semiconductor type being P-type and the second semiconductor type being N-type, a negative potential instead of the above-mentioned positive potential should be applied to the associated word line. Other settings for the read operation are the same as described above.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a ROM device, comprising the steps of:
   (1) preparing a semiconductor substrate, and then forming a first insulating layer over the substrate;
   (2) removing selected portions of the first insulating layer so as to form a plurality of substantially parallel-spaced trenches therein in a first direction;
   (3) forming a plurality of first diffusion regions of a first semiconductor type each in a lower portion of one of the trenches to serve as a plurality of bit lines for the ROM device;
   (4) forming a plurality of second diffusion regions of a second semiconductor type each in an upper portion of one of the trenches;
   (5) forming a second insulating layer over the first insulating layer;
   (6) removing selected portions of the second insulating layer so as to form a plurality of contact windows which expose a number of predefined portions of the second diffusion regions that are associated with a first group of memory cells of the ROM device that are to be set to a permanently-ON state;
   (7) forming a conductive layer over the second insulating layer, the conductive layer filling up each of the contact windows to come into electrical contact with the exposed portions of the second diffusion regions; and
   (8) removing selected portions of the conductive layer so as to form a plurality of substantially parallel-spaced word lines in a second direction intercrossing the bit lines.

2. The method of claim 1, wherein the first semiconductor type is N-type while the second semiconductor type is P-type.

3. The method of claim 1, wherein the first semiconductor type is P-type while the second semiconductor type is N-type.

4. The method of claim 1, wherein the first insulating layer is a layer of silicon dioxide.

5. The method of claim 1, wherein in said step (2), a predetermined thickness of the first insulating layer is left between the bottom of the trenches and a surface of the silicon substrate.

6. The method of claim 2, wherein in said step (3), the first diffusion regions are formed by the following steps of:
   (i) depositing a plurality of polysilicon layers respectively into each of the trenches;
   (ii) doping an impurity material of the first semiconductor type into the polysilicon layers; and
   (iii) performing an anisotropic etch-back process on the impurity-doped polysilicon layers until the top surface thereof is lower than the topmost surface of the first insulating layer.

7. The method of claim 3, wherein in said step (3), the first diffusion regions are formed by the following steps:
   (i) depositing a plurality of polysilicon layers respectively into each of the trenches;
   (ii) doping an impurity material of the first semiconductor type into the polysilicon layers; and
   (iii) performing an anisotropic etch-back process on the impurity-doped polysilicon layers until the top surface thereof is lower than the topmost surface of the first insulating layer.

8. The method of claim 2, wherein in said step (4), the second diffusion regions are formed by the following steps of:
   (i) depositing a plurality of polysilicon layers respectively on each of the first diffusion regions in the trenches;
   (ii) doping an impurity material of the second semiconductor type into the polysilicon layers; and
   (iii) removing an upper portion of the impurity-doped polysilicon layers until the top surface thereof is level with the topmost surface of the first insulating layer.

9. The method of claim 8, wherein the upper portion of the doped polysilicon layers is removed by performing an anisotropic etch-back process.

10. The method of claim 8, wherein the upper portion of the doped polysilicon layers is removed by performing a CMP process.

11. The method of claim 3, wherein in said step (4), the second diffusion regions are formed by the following steps of:
   (i) depositing a plurality of polysilicon layers respectively on each of the first diffusion regions in the trenches;
   (ii) doping an impurity material of the second semiconductor type into the polysilicon layers; and
   (iii) removing an upper portion of the impurity-doped polysilicon layers until the top surface thereof is level with the topmost surface of the first insulating layer.

12. The method of claim 11, wherein the upper portion of the doped polysilicon layers is removed by performing an anisotropic etch-back process.

13. The method of claim 11, wherein the upper portion of the doped polysilicon layers is removed by performing a CMP process.

14. The method of claim 2, wherein in said step (4), the second diffusion regions are formed by the following steps of:
   (i) depositing a plurality of polysilicon layers lightly doped with an impurity material of the first semiconductor type respectively in each of the trenches,
   (ii) removing an upper portion of the lightly-doped polysilicon layers until the top surface thereof is level with the topmost surface of the insulating layer; and
   (iii) doping an impurity material of the second semiconductor type into the lightly-doped polysilicon layers so as to turn the lightly-doped polysilicon layers into a plurality of heavily-doped polysilicon layers serving as the second diffusion regions.

15. The method of claim 14, wherein the upper portion of the lightly-doped polysilicon layers is removed by performing an anisotropic etch-back process.

16. The method of claim 14, wherein the upper portion of the lightly-doped polysilicon layers is removed by performing CMP process.

17. The method of claim 3, wherein in said step (4), the second diffusion regions are formed by the following steps of:
   (i) depositing a plurality of polysilicon layers lightly doped with an impurity material of the first semiconductor type respectively in each of the trenches,
   (ii) removing an upper portion of the lightly-doped polysilicon layers until the top surface thereof is level with the topmost surface of the insulating layer; and
   (iii) doping an impurity material of the second semiconductor type into the lightly-doped polysilicon layers so as to turn the lightly-doped polysilicon layers into a plurality of heavily-doped polysilicon layers serving as the second diffusion regions.

18. The method of claim 17, wherein the upper portion of the lightly-doped polysilicon layers is removed by performing an anisotropic etch-back process.

19. The method of claim 17, wherein the upper portion of the lightly-doped polysilicon layers is removed by performing a CMP process.

20. The method of claim 1, wherein in said step (5), the second insulating layer is a layer of silicon dioxide.

21. The method of claim 1, wherein in said step (5), the second insulating layer is a layer of silicon nitride.

22. The method of claim 1, wherein in said step (7), the conductive layer is a layer of highly-doped polysilicon.

23. The method of claim 1, wherein in said step (7), the conductive layer is a layer of titanium.

24. The method of claim 1, wherein in said step (7), the conductive layer is a layer of aluminum.

25. The method of claim 1, wherein in said step (7), the conductive layer is a layer of tungsten.

26. The method of claim 1, wherein the word lines intercross the bit lines substantially at a right angle.

* * * * *